(12) United States Patent
Lu et al.

(10) Patent No.: US 9,318,396 B1
(45) Date of Patent: Apr. 19, 2016

(54) METHOD OF FABRICATING FLASH MEMORY

(71) Applicant: Powerchip Technology Corporation, Hsinchu (TW)

(72) Inventors: Ming-Chen Lu, Hsinchu (TW); Chia-Ming Wu, Taipei (TW)

(73) Assignee: Powerchip Technology Corporation, Hsinchu Science Park, Hsinchu (TW)

( * ) Notice: Subject to any disclaimer, the term of this patent is extended or adjusted under 35 U.S.C. 154(b) by 0 days.

(21) Appl. No.: 14/693,857

(22) Filed: Apr. 22, 2015

(30) Foreign Application Priority Data

Oct. 21, 2014 (TW) .............................. 103136317 A

(51) Int. Cl.
   *H01L 27/115* (2006.01)
   *H01L 21/66* (2006.01)
   *H01L 29/66* (2006.01)
   *H01L 29/06* (2006.01)
   *H01L 21/311* (2006.01)

(52) U.S. Cl.
   CPC .......... *H01L 22/20* (2013.01); *H01L 21/31111* (2013.01); *H01L 21/31144* (2013.01); *H01L 29/0653* (2013.01); *H01L 29/66795* (2013.01); *H01L 29/66825* (2013.01)

(58) Field of Classification Search
   CPC ................... H01L 27/11521; H01L 29/42324; H01L 29/66825; H01L 29/785; H01L 29/66795; H01L 29/42336; H01L 29/66833; H01L 29/66818; H01L 29/788; H01L 27/11517; H01L 27/11551
   See application file for complete search history.

(56) References Cited

U.S. PATENT DOCUMENTS

| | | | |
|---|---|---|---|
| 2009/0096010 A1 | 4/2009 | Hyun | |
| 2013/0240971 A1 | 9/2013 | Takekida | |
| 2013/0307047 A1* | 11/2013 | Sakuma | H01L 29/66825 257/316 |
| 2014/0339622 A1* | 11/2014 | Murata | H01L 27/11524 257/316 |
| 2015/0008501 A1* | 1/2015 | Sakuma | H01L 21/28273 257/316 |
| 2015/0287728 A1* | 10/2015 | Leobandung | H01L 21/845 257/348 |

* cited by examiner

*Primary Examiner* — Jaehwan Oh
(74) *Attorney, Agent, or Firm* — Winston Hsu; Scott Margo

(57) ABSTRACT

A method of fabricating a flash memory includes providing a fin structure. The fin structure includes a floating gate material, an oxide layer and a semiconductive layer. An insulating layer is disposed at two sides of the fin structure. Then, a dielectric layer conformally covers the floating gate material and insulating layer. Later, a patterned first mask layer, a patterned second mask layer, and a control gate are stacked on the dielectric layer from bottom to top. The control gate crosses at least one fin structure. Next, at least one isotropic etching step is performed to entirely remove the exposed dielectric layer.

14 Claims, 8 Drawing Sheets

METHOD OF FABRICATING FLASH MEMORY

CROSS REFERENCE TO RELATED APPLICATION

This application claims the benefit of Taiwanese Patent Application No. 103136317, filed on Oct. 21, 2014, the contents of which are hereby incorporated by reference in their entirety.

BACKGROUND OF THE INVENTION

1. Field of the Invention

The present invention relates to a method of fabricating a flash memory. In particular, the present invention relates to a method of fabricating a flash memory by an isotropic etching process.

2. Description of the Prior Art

Non-volatile semiconductor memories are used in a number of devices, including cellular telephones, digital cameras, personal digital assistants, mobile computing devices and non-mobile computing devices.

As one type of non-volatile memory device, a split gate flash memory device includes a floating gate and a control gate that are separated from each other. The floating gate is electrically isolated from the external environment, and stores information using the characteristic that the current of a memory cell varies according to electron injection to and removal from the floating gate.

When these flash memories are fabricated by conventional processes, however, they may suffer from current leakage between floating gates.

SUMMARY OF THE INVENTION

To solve the current leakage problem, a new method of fabricating a flash memory is needed.

According to the present invention, a method of fabricating a flash memory includes providing at least a fin structure and an insulating layer disposed at two sides of the fin structure, wherein the fin structure comprises a floating gate material, an oxide layer and a semiconductive layer arranged in a top-down sequence. Part of the floating gate material protrudes from the insulating layer and a height of the insulating layer is greater than a height of the oxide layer. Later, a dielectric layer is formed conformally covering the floating gate material and the insulating layer. Subsequently, a patterned first mask layer, a patterned second mask layer and a control gate are formed to stack in a top-down sequence on part of the dielectric layer, and the remaining part of the dielectric layer is exposed. An extending direction of the patterned first mask layer, an extending direction of the patterned second mask layer and an extending direction of the control gate are perpendicular to an extending direction of the fin structure. After that, at least one first isotropic etching step is performed to remove the exposed dielectric layer until the exposed dielectric layer is removed entirely to expose the floating gate material underneath the exposed dielectric layer. Finally, a floating gate material patterning step is performed, wherein the floating gate material patterning step comprises removing the exposed floating gate material to format least one floating gate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 8 schematically depict a method of fabricating a flash memory according a preferred embodiment of the present invention, wherein FIG. 3 depicts a three dimensional diagram of a semi-finished flash memory of the present invention, FIG. 4 shows sectional views taken along lines AA' and BB' of the semi-finished flash memory in FIG. 3, FIG. 8 depicts a three dimensional diagram of a flash memory of the present invention and FIG. 7 shows sectional views taken along lines AA' and BB' of the flash memory in FIG. 8.

DETAILED DESCRIPTION

Figure 1:
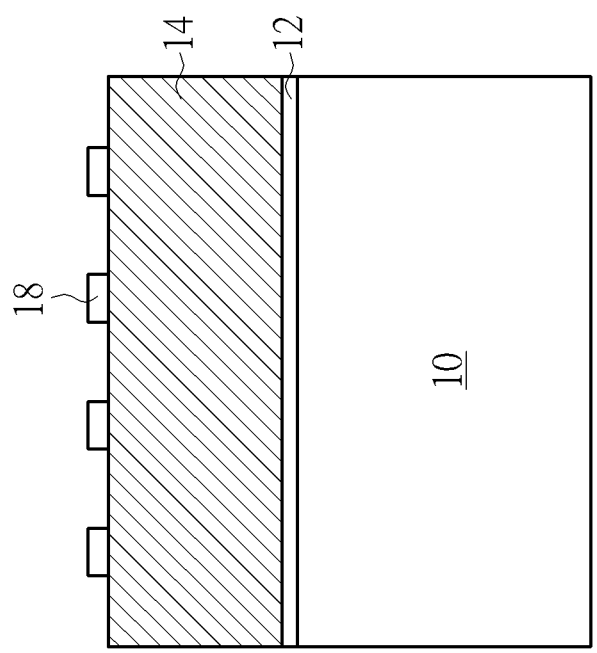

FIG. 1 to FIG. 8 schematically depict a method of fabricating a flash memory according a preferred embodiment of the present invention. As shown in FIG. 1, a first silicon substrate 10 is provided. Later, an oxide layer 12 and a second silicon substrate 14 are formed in a bottom-up sequence. Alternatively, a silicon on insulator substrate is provided, wherein the silicon on insulator substrate includes the first silicon substrate 10, the oxide layer 12 and the second silicon substrate 14 stacked from bottom to top. The first silicon substrate 10 may be a semiconductive material having a single crystalline silicon or polysilicon. The oxide layer 12 may be silicon oxide. The second silicon substrate 14 may be a semiconductive material having a single crystalline silicon or polysilicon. According to a preferred embodiment of the present invention, the second silicon substrate may be a silicon nitride substrate.

Figure 2:
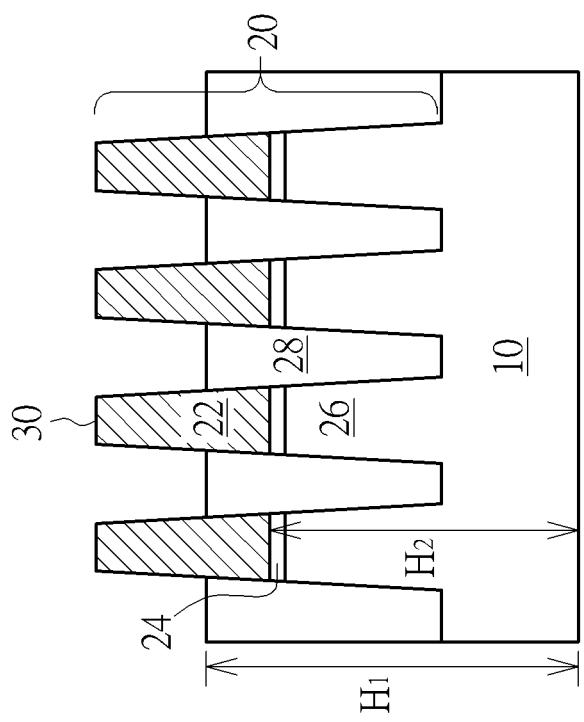

Next, a patterned mask layer 18 is formed. As shown in FIG. 2, the second silicon substrate 14, the oxide layer 12 and a first silicon substrate 10 take the patterned mask layer 18 as a mask to form numerous fin structures 20. After that, the patterned mask layer 18 is removed. In detail, the step of patterning the second silicon substrate 14, the oxide layer 12 and the first silicon substrate 10 includes etching through the second silicon substrate 14, etching through the oxide layer 12 and etching part of the first silicon substrate 10 to form the fin structures 20 on the first silicon substrate 10. Each fin structure 20 includes a floating gate material 22, an oxide layer 24 and a semiconductive layer 26. The floating gate material 22 is made of the second silicon substrate 14. The oxide layer 24 is made of the oxide layer 12. The semiconductive layer 26 is made of the first silicon substrate 10. It is noteworthy that the oxide layer 24 is disposed between the floating gate material 22 and the semiconductive layer 26. The floating gate material 22 includes a single crystalline silicon or polysilicon. As shown in FIG. 2, an insulating layer 28 is formed between each fin structure 20. Alternatively, the insulating layer 28 can be formed to surround each fin structure 20. The height $H_1$ of the insulating layer 28 is greater than the height $H_2$ of the oxide layer 24. Furthermore, the insulating layer 28 is lower than the top surface 30 of the floating gate material 22. Therefore, only part of the floating gate material 22 is exposed and protrudes from the insulating layer 28, and the oxide layer 24 and the semiconductive layer 26 are embedded within the insulating layer 28, so that part of each fin structure 20 is exposed through the insulating layer 28. The insulating layer 28 may be silicon oxide, silicon nitride or other suitable materials.

Figure 3:
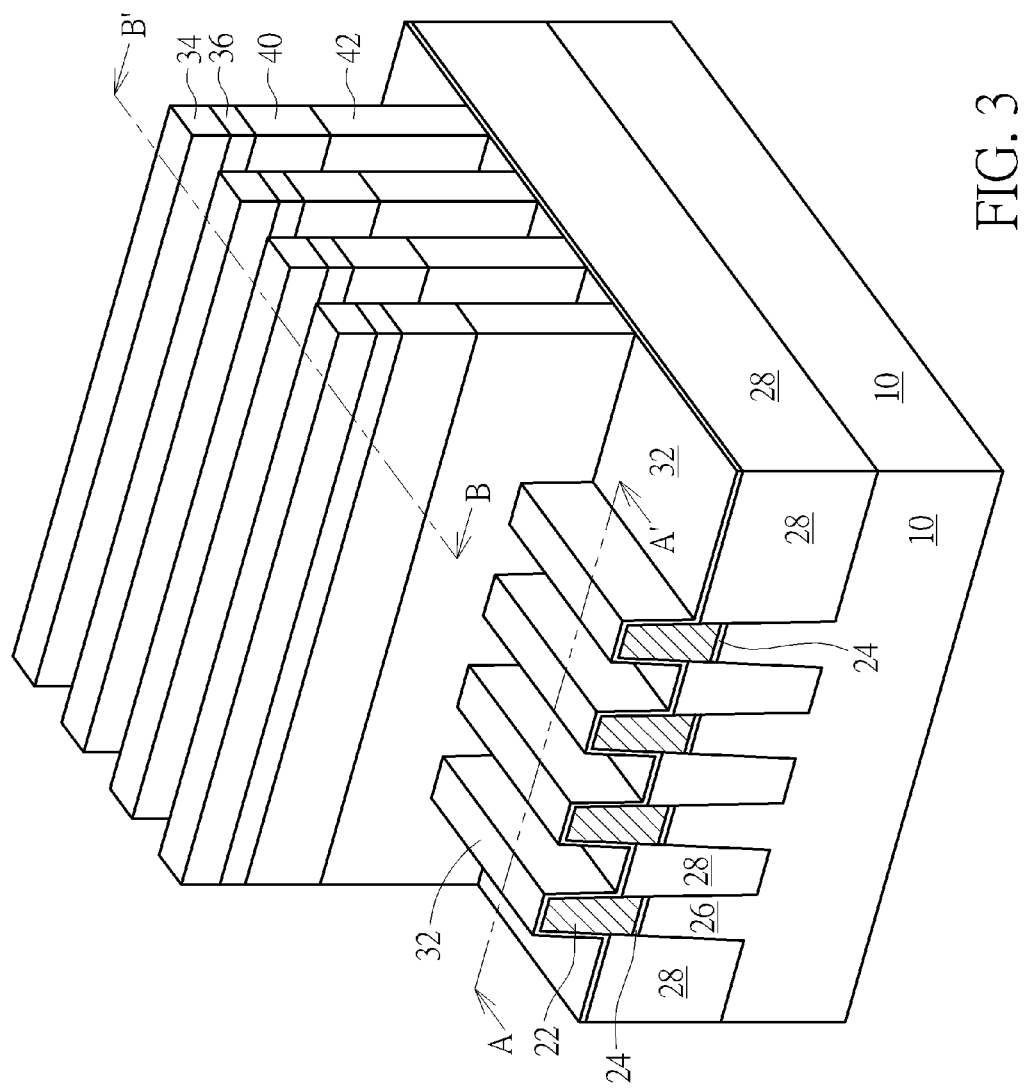
Figure 4:
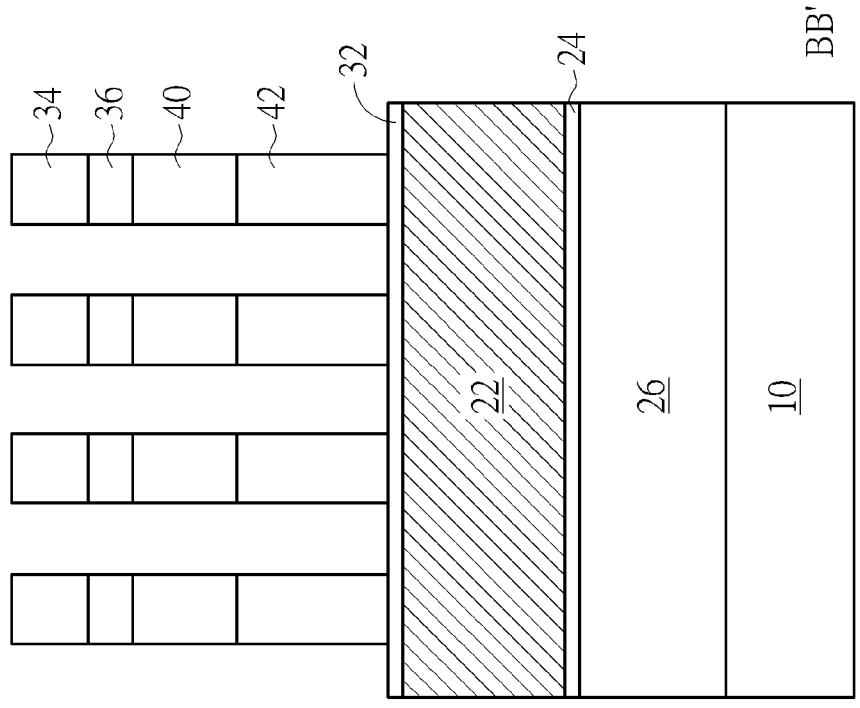
Figure 4:
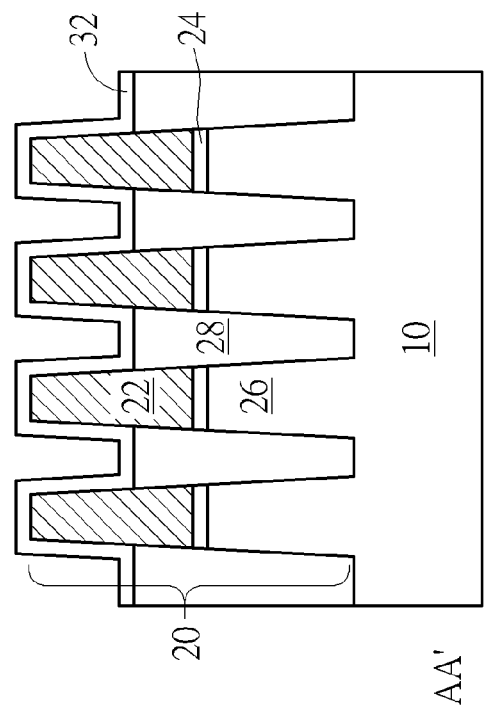

FIG. 3 depicts a three dimensional diagram of a semi-finished flash memory of the present invention. FIG. 4 shows sectional views taken along lines AA' and BB' of the semi-finished flash memory illustrated in FIG. 3.

As shown in FIG. 3 and FIG. 4, a dielectric layer 32 is formed to conformally and entirely cover the floating gate material 22 and the insulating layer 28. The dielectric layer 32 may be oxide-nitride-oxide (ONO). Later, a conductive layer (not shown), a second mask layer (not shown), and a first mask layer (not shown) are formed in sequence. A metal layer (not shown) may be selectively formed on the conductive layer.

The first mask layer and the second mask layer are patterned to form a patterned first mask layer 34 and a patterned second mask layer 36. After that, the metal layer is patterned to form a patterned metal layer 40 and the conductive layer is patterned to form numerous control gates 42 by taking the patterned first mask layer 34 and the patterned second mask layer 36 as a mask to expose the dielectric layer 32 between the control gates 42. At this point, the patterned second mask layer 36, the patterned first mask layer 34, the control gates 42 and the patterned metal layer 40 form numerous strip structures and the extending direction of the strip structures is perpendicular to the extending direction of the fin structures 20.

The control gate 42 may be poly silicon, metal or other conductive materials. The patterned metal layer 40 may be tungsten, copper, or other metals. The patterned metal layer 40 can be replaced by an alloy or metallic compound. In addition, a barrier layer (not shown) can be disposed between the control gate 42 and the patterned metal layer 40. The barrier layer can be titanium nitride or tantalum nitride. The patterned first mask layer 34 may be silicon oxide, silicon nitride, silicon oxynitride, a compound made of silicon nitride and silicon oxide or other suitable materials. The patterned second mask layer 36 may be metal, a metallic compound, alloy or single crystalline silicon or polysilicon. It is noteworthy that the material of the patterned second mask layer 36 must be a material which has a high etching selectivity with respect to silicon oxide and silicon nitride due to a first isotropic etching step and a second isotropic etching step that is performed later.

Figure 5:
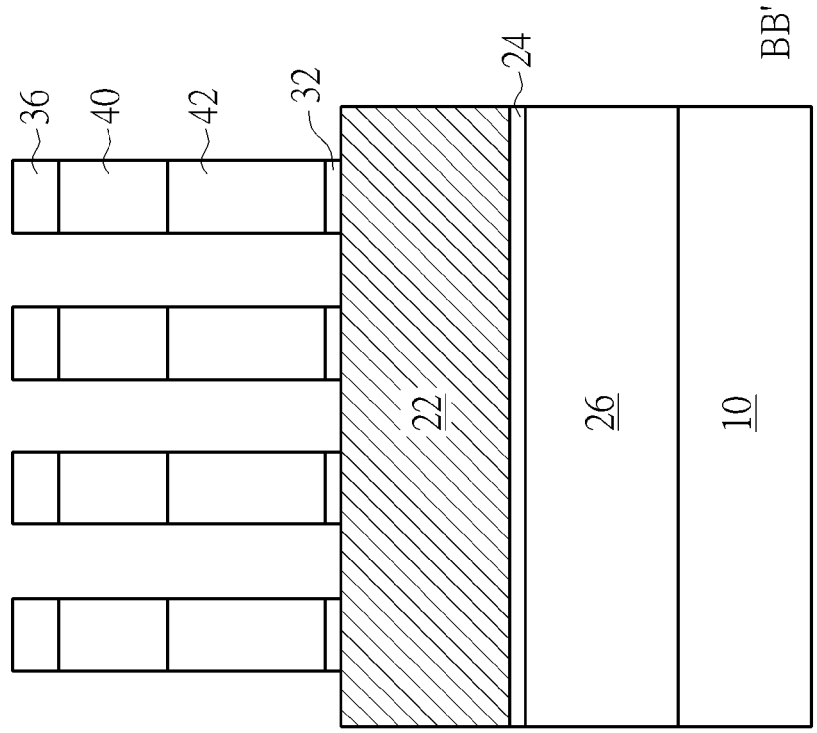
Figure 5:
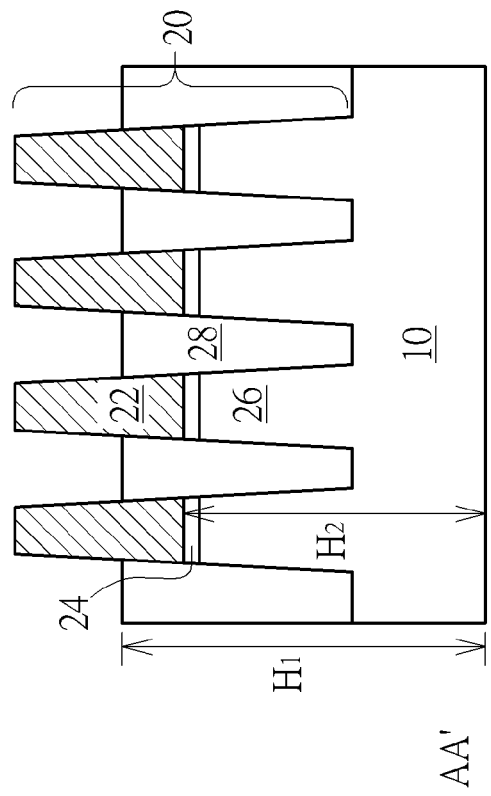
Figure 6:
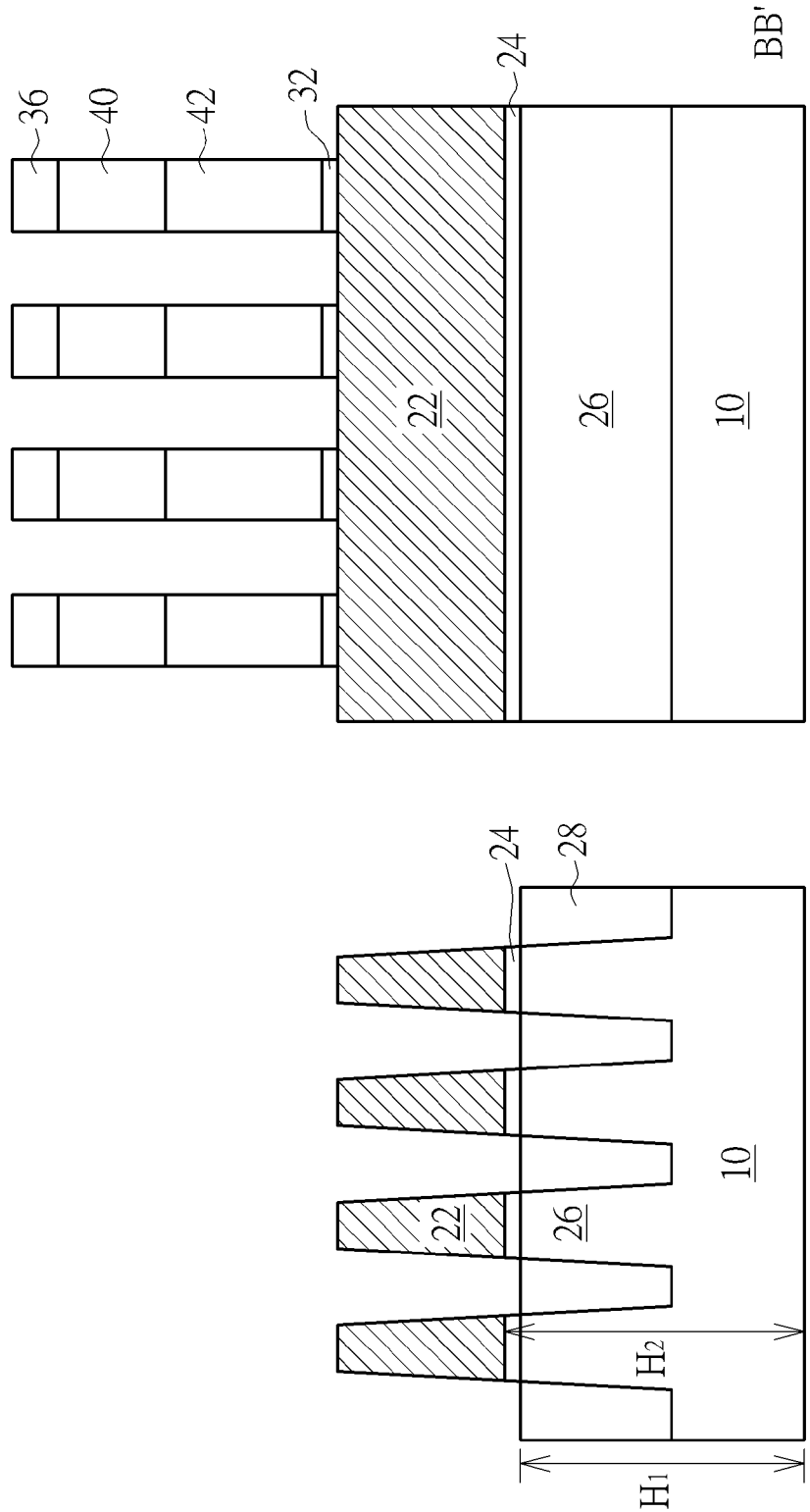
Figure 7:
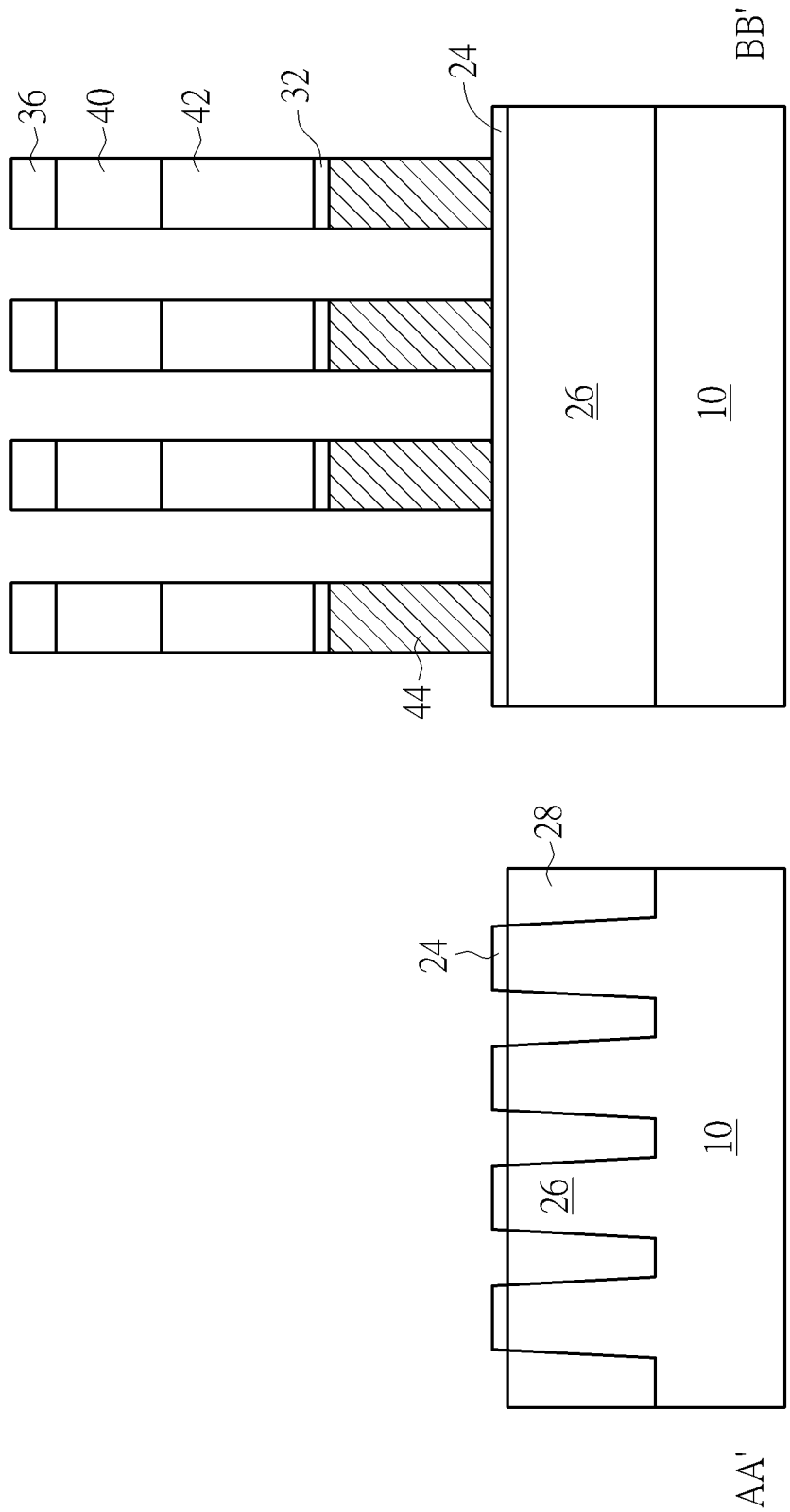

FIGS. 5-7 depict a method of fabricating a flash memory. As shown in FIG. 5, a first isotropic etching step is performed. During the first isotropic etching step, the exposed dielectric layer 32 is removed entirely in an isotropic fashion by taking the floating gate material 22 and the insulating layer 28 as etching stop layers to expose part of the fin structure 20. In detail, the floating gate material 22 protruding from the insulating layer 28 that is not covered by the control gate 42 is exposed. Furthermore, during the first isotropic etching step, the patterned first mask layer 34 is removed by taking the patterned second mask layer 36 as an etching stop layer. More specifically, the first isotropic etching step includes at least a dry etch, at least a wet etch or combinations of alternately performed numerous dry etches and wet etches. The first isotropic etching step can be repeated at least once or several times if needed, until the exposed dielectric layer 32 is removed completely. The etchant of the wet etch may be hydrofluoric acid (HF), but is not limited thereto. The etchant of the dry etchant may be difluoromethane ($CH_2F_2$), but is not limited thereto. For example, if the first isotropic etching step includes a wet etch, after the wet etch is completed, a check step is performed to check whether any of the exposed dielectric layer 32 remains. If some of the exposed dielectric layer 32 remains, another wet etch is performed to remove the remaining exposed dielectric layer 32. The first isotropic etching step and the check step are repeated until the exposed dielectric layer 32 is considered completely removed by the first isotropic etching step. It is noteworthy that, when etching the exposed dielectric layer 32, part of the insulating layer 28 is etched as well. When the exposed dielectric layer 32 is determined to be completely removed, the height $H_1$ of the insulating layer 28 is checked. If the height $H_1$ of the insulating layer 28 is greater than the height $H_2$ of the oxide layer 24, a second isotropic etching step is performed. If the height $H_1$ of the insulating layer 28 is smaller than the height $H_2$ of the oxide layer 24, a floating gate material patterning step is performed.

As shown in FIG. 6, according to a preferred embodiment of the present invention, when the exposed dielectric layer 32 is completely removed and the height $H_1$ of the insulating layer 28 is greater than the height $H_2$ of the oxide layer 24, a second isotropic etching step is performed to remove part of the insulating layer 28 in an isotropic way. The second isotropic etching step includes at least a dry etch, at least a wet etch or a combination of alternately performed numerous dry and wet etches. The etchant of the wet etch may be hydrofluoric acid (HF), but is not limited thereto. The etchant of the dry etchant in the second isotropic etching step may be perfluorobutadiene ($C_4F_6$), but is not limited thereto. In addition, the second isotropic etching step can be repeated several times until the height $H_1$ of the insulating layer 28 is smaller than the height $H_2$ of the oxide layer 24. Moreover, during the second isotropic etching step, the patterned second mask layer 36 is used as a mask to protect the patterned metal layer 40 and the control gate 42.

According to a preferred embodiment of the present invention, after the first isotropic etching step is completed and the height $H_1$ of the insulating layer 28 is determined to be smaller than the height $H_2$ of the oxide layer 24, or after the second isotropic etching step is completed and the height $H_1$ of the insulating layer 18 is determined to be smaller than the height $H_2$ of the oxide layer 24, a floating gate material patterning step is performed.

Figure 8:
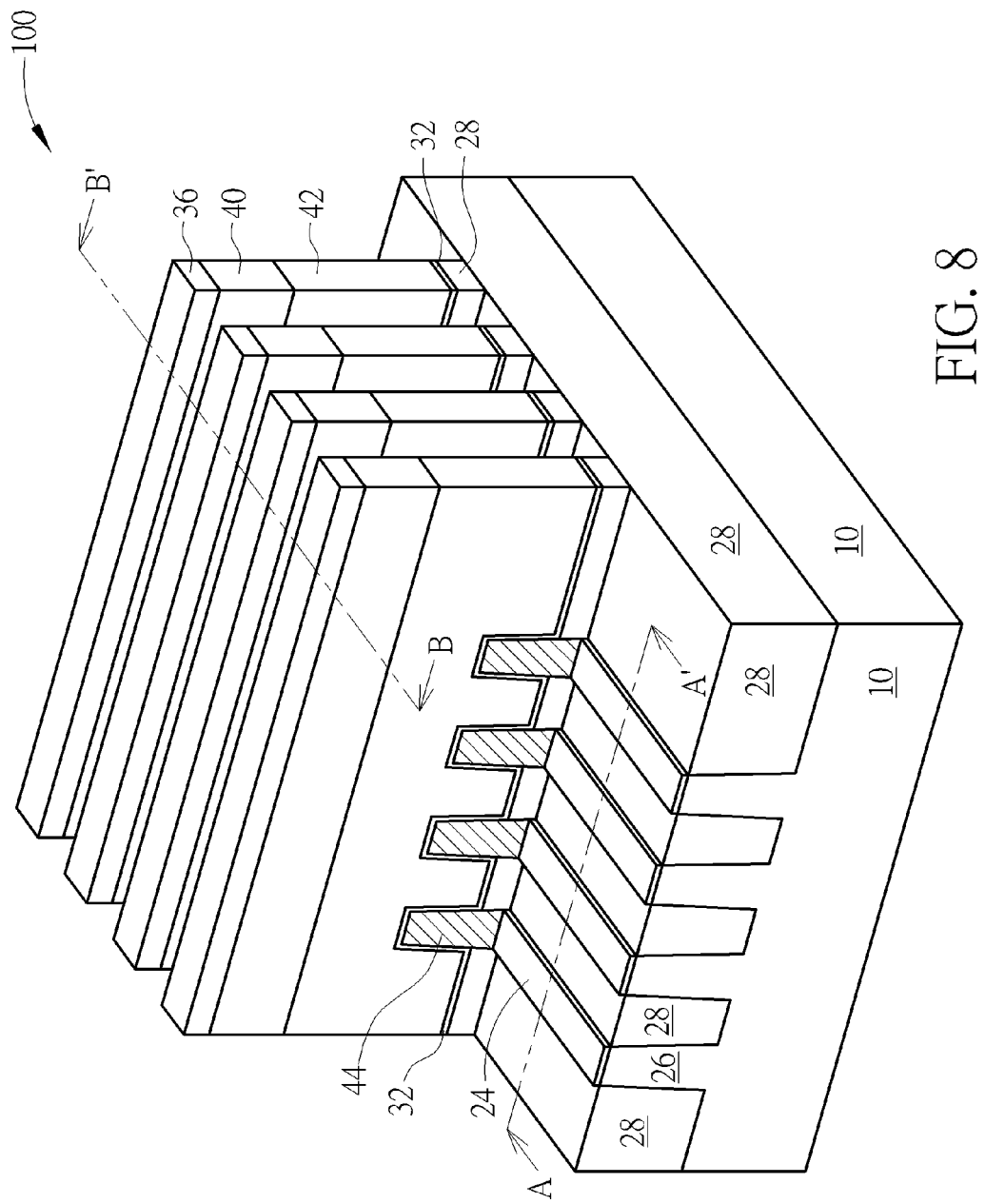

FIG. 8 depicts a three dimensional diagram of a flash memory of the present invention. FIG. 7 shows sectional views taken along AA' and BB' of the flash memory in FIG. 8. As shown in FIG. 7 and FIG. 8, a floating gate material patterning step is performed to remove the floating gate material 22 which is not covered by the patterned second mask layer 36 and the control gate 42 to form numerous floating gates 44. That is, the remaining floating gate material 22 directly beneath the control gate 42 serves as a floating gate 44.

In detail, the floating gate material 22 on the oxide layer 24 not covered by the patterned second mask layer 36 is removed by a dry etch taking the oxide layer 24 as an etching stop layer. Therefore, the oxide layer 24 under the floating gate material layer 22 is exposed. During the floating gate material patterning step, the patterned second mask layer 36 serves as a mask to protect the metal layer 40 and the control gate 42. Since the patterned second mask layer 36 serves as a mask, the patterned second mask layer 36 may be consumed during the floating gate material patterning step. It is possible that the patterned second mask layer 36 is entirely consumed after the floating gate material patterning step, i.e. the floating gate material layer 22 is patterned while the patterned second mask layer 36 is removed. The etchant of the dry etch in the floating gate material patterning step is preferably hydrogen bromide, and the carrier gas is preferably oxygen, but is not limited to those chemical compounds. At this point, the flash memory 100 of the present invention is completed.

In the conventional method of making a flash memory, the floating gate material will be left on the sidewall of the oxide layer 24 which is higher than the insulating layer 28. Therefore, the floating gates 44 will electrically connect to each other through this floating gate material. According to the present invention, a second mask layer 36 is added in the present invention. Furthermore, the dielectric layer 32 is specially removed by an isotropic etching step. In addition, part of the insulating layer 28 between each fin structure 20 is removed by an isotropic etching step. In this way, the problem of the floating gates 44 electrically connecting to each other can be solved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a flash memory, comprising:
    providing at least a fin structure and an insulating layer disposed at two sides of the fin structure, wherein the fin structure comprises a floating gate material, an oxide layer and a semiconductive layer arranged in a top-down sequence, and part of the floating gate material protrudes from the insulating layer and a height of the insulating layer is greater than a height of the oxide layer;
    forming a dielectric layer conformally covering the floating gate material and the insulating layer;
    forming a patterned first mask layer, a patterned second mask layer, and a control gate stacked in a top-down sequence on part of the dielectric layer, and exposing the other part of the dielectric layer, wherein an extending direction of the patterned first mask layer, an extending direction of the patterned second mask layer and an extending direction of the control gate are perpendicular to an extending direction of the fin structure;
    performing at least one first isotropic etching step to remove the exposed dielectric layer until the exposed dielectric layer is removed entirely to expose the floating gate material underneath the exposed dielectric layer; and
    performing a floating gate material patterning step, wherein the floating gate material patterning step comprises removing the exposed floating gate material to form at least one floating gate.

2. The method of fabricating a flash memory of claim 1, further comprising repeating the first isotropic etching step at least once until the exposed dielectric layer is entirely removed.

3. The method of fabricating a flash memory of claim 1, wherein the first isotropic etching step comprises removing part of the insulating layer.

4. The method of fabricating a flash memory of claim 1, further comprising:
    before performing the floating gate material patterning step, checking the height of the insulating layer, and if the height of the insulating layer is smaller than the height of the oxide layer, performing the floating gate material patterning step.

5. The method of fabricating a flash memory of claim 1, further comprising:
    before performing the floating gate material patterning step, checking the height of the insulating layer, and if the height of the insulating layer is greater than the height of the oxide layer, performing a second isotropic etching step to remove part of the insulating layer to make the height of the insulating layer smaller than the height of the oxide layer.

6. The method of fabricating a flash memory of claim 1, wherein when removing the dielectric layer, the patterned first mask layer is removed simultaneously.

7. The method of fabricating a flash memory of claim 1, wherein the patterned first mask layer comprises silicon nitride, silicon oxide or silicon oxynitride.

8. The method of fabricating a flash memory of claim 1, wherein the patterned second mask layer comprises metal, metallic compound, alloy, single crystalline silicon or polysilicon.

9. The method of fabricating a flash memory of claim 1, wherein the dielectric layer comprises oxide-nitride-oxide.

10. The method of fabricating a flash memory of claim 1, wherein the floating gate material comprises single crystalline silicon or polysilicon.

11. The method of fabricating a flash memory of claim 1, wherein the floating gate material patterning step is performed by using the oxide layer as an etching stop layer.

12. The method of fabricating a flash memory of claim 1, wherein the first isotropic etching step utilizes the patterned first mask layer as a mask and utilizes the floating gate material and the insulting layer as etching stop layers.

13. The method of fabricating a flash memory of claim 1, wherein during the floating gate material patterning step, the patterned second mask layer is removed simultaneously.

14. The method of fabricating a flash memory of claim 1, further comprising:
    forming a patterned metal layer between the patterned second mask layer and the control gate, and an extending direction of the patterned metal layer is perpendicular to the extending direction of the fin structure.

* * * * *